United States Patent [19]

Turner

[11] Patent Number: 4,816,666

[45] Date of Patent: Mar. 28, 1989

[54] APPARATUS AND METHODS FOR INSPECTION OF ELECTRICAL MATERIALS AND COMPONENTS

[75] Inventor: Charles W. Turner, Virginia Water, England

[73] Assignee: National Research Development Corporation, London, England

[21] Appl. No.: 61,307

[22] Filed: Jun. 12, 1987

[30] Foreign Application Priority Data

Jun. 16, 1986 [GB] United Kingdom ............... 8614608

[51] Int. Cl.$^4$ .................................... H01J 40/14
[52] U.S. Cl. .................................... 250/215; 250/572; 324/456
[58] Field of Search ............... 324/456; 250/215, 571, 250/572, 214 R

[56] References Cited

U.S. PATENT DOCUMENTS 4,208,624 6/1980 Miller ..................... 324/60
4,443,764 4/1984 Suh et al. ............... 324/456

FOREIGN PATENT DOCUMENTS 0050475 4/1982 European Pat. Off. .
2034898 6/1980 United Kingdom ............... 324/456

OTHER PUBLICATIONS

Patent Abstracts of Japan, vol. 5, No. 38(P-52), 12th Mar. 1981; of Application No. 54-7531, published Dec. 1980.

Primary Examiner—David C. Nelms
Attorney, Agent, or Firm—Cushman, Darby & Cushman

[57] ABSTRACT

A capacitor has a top plate 2 in the form of a photodiode array and a bottom plate 2. An RF source 3 is connected between plates 1 and 2. Insulating or semiconducting material to be tested is inserted between the plates 1 and 2 to act as dielectric. Where a printed circuit board or other conductive electrical component is to be tested it forms top plate 2. A flying spot scanner 11 produces a modulated light beam 12 which scans the top surface of plate 2. The resulting modulated photocurrent envelope is detected and displayed in a display monitor 15 in synchronism with the scanning beam.

11 Claims, 2 Drawing Sheets

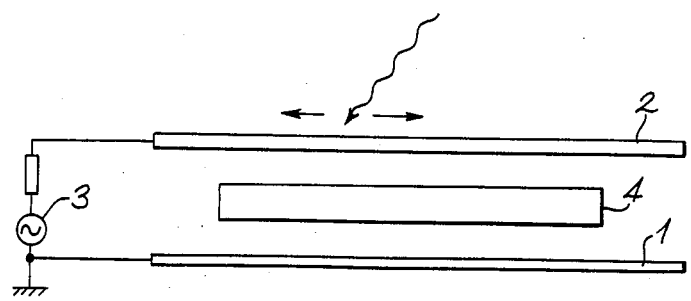
Fig. 1
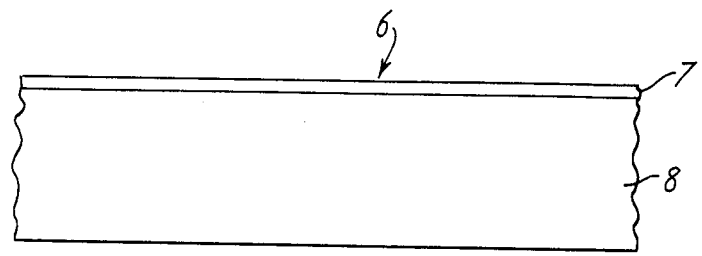
Fig. 2
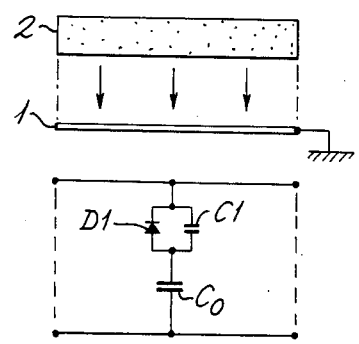 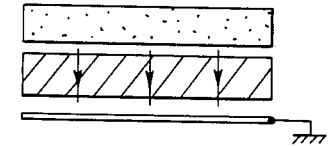
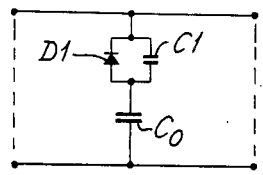 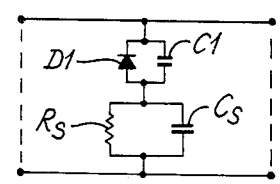
Fig. 3a    Fig. 3b

APPARATUS AND METHODS FOR INSPECTION OF ELECTRICAL MATERIALS AND COMPONENTS

FIELD OF THE INVENTION

This invention relates to apparatus and method for the inspection of electrical materials and components.

BACKGROUND OF THE INVENTION

There is a requirement for the inspection of semiconductor and insulating material, which is in slice form and which has nominally uniform conductivity and/or permittivity over its surface area, to determine whether there are unacceptable variations in uniformity. There is also a requirement for the inspection of printed circuit boards for any breaks in the conductive areas of the circuit deposited on the board.

SUMMARY OF THE INVENTION

According to the invention an apparatus for the inspection of flat electrically insulating and/or conductive components comprises a capacitor having a first plate in the form of a photodiode array, a second plate, means for applying a radio frequency signal between the plates, means for scanning the exterior surface of the photodiode array with an optical beam and means for detecting changes in the capacitor current flow as the beam scans the array.

According to the invention in another aspect, a method of inspecting electrically insulating and/or conductive components comprises the steps of: inclusion of a component to be tested as part of a capacitor, one plate of which comprises a photodiode array, applying a radio frequency signal across the capacitor, scanning the surface of the array with an optical beam and detecting any changes in the resulting current flow as the beam scans the array.

Where a slice of semiconductor or insulating material is being inspected the slice constitutes at least part of the dielectric of the capacitor. Where an electrically conductive component is being examined, for example where it is desired to inspect the pattern of electrical conductors in a printed circuit board of the like, then the component being tested is used as the second plate of the capacitor.

The electric field strength at any point in the plane of the capacitor will be affected by the electrical properties of the dielectric at that point. The RF field distribution is monitored by the scanning of the beam across the surface of the array. Preferably the beam is modulated and scans in a conventional rectangular TV-type raster pattern. The photodiode array rectifies the RF signal applied across the capacitor and the resulting reverse voltage bias at any point in the capacitor will be related to the amplitude of the electric field at that point and will be approximately proportional to the local value of the RF electric field. The photodiode current at the modulation frequency of the beam will be dependent upon the local value of reverse bias and therefore provides a means of directly monitoring the RF electric field distribution across the surface of the capacitor. Any change in the electrical properties of the dielectric will therefore appear as a change in the monitored value of reverse voltage bias. This monitored value can be displayed in a display device operating in synchronism with the scanning beam.

An alternative means of monitoring the RF field distribution is to use the inherent non-linearity of the photodiode to mix the RF signal with the photodiode current and measure the variation in either amplitude or phase of the sum or difference frequency output as the scanning beam traverses the surface of the photodiode array.

Where the object being examined is a printed circuit board and constitutes the second plate of the capacitor then the pattern of the RF electric field should correspond to the expected pattern of conductors laid down on the surface of the board. The displayed pattern can be compared with the expected pattern to show up any breaks in the electrical conductors.

BRIEF DESCRIPTION OF THE DRAWINGS

In order that the invention may be more fully understood reference will now be made to the accompanying drawings in which:

FIG. 1 illustrates a capacitor as used in the invention,

FIG. 2 illustrates a detail of the photodiode constituting one plate of the capacitor;

FIG. 3a and FIG. 3b are equivalent circuits for a unit cell of the apparatus with and without the sample being present.

DETAILED DESCRIPTION OF THE INVENTION

Figure 4:
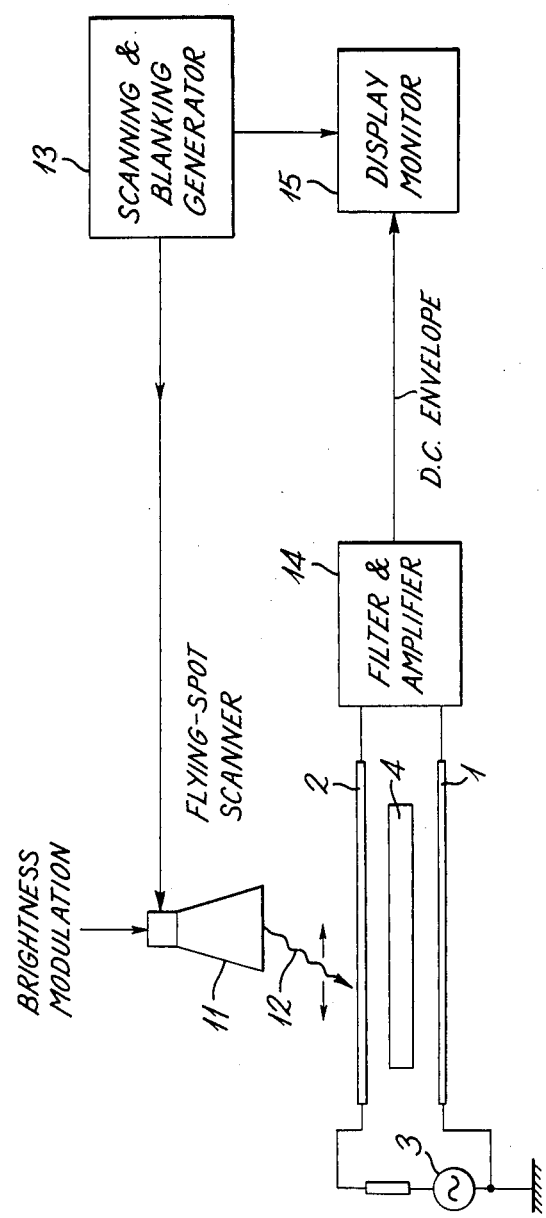
FIG. 4 illustrates an embodiment of the invention in block diagrammatic form.

Referring now to FIG. 1 there is shown therein a capacitor as used in an apparatus for inspection of flat electrically insulating and/or conductive components. The capacitor comprises a ground plate 1 and spaced above it a top plate structure 2 in the form of a photodiode array. A gap is provided between plate 1 and plate 2 and an RF source 3 is connected between the plates. A suitable frequency for source 3 is in the range 0.1 to 10 MHz but higher frequencies can be used. Provision is made for inserting a sample 4 which it is desired to inspect in the air gap between the plates.

The structure of top plate 2 is shown in more detail in FIG. 2. Plate 2 comprises an outer thin semi-transparent metal or semi-conductor conducting film 6 which forms a light sensitive Schottky barrier or heterojunction 7 at the interface between film 6 and a high purity silicon substrate 8. Junction 7 provides the photodiode junction from which the output is derived. No counter or bottom electrode is provided to the junction 7 because this would short out any variations in reverse bias voltage in the plane of the capacitor.

An elemental area of the capacitor with and without the presence of a sample is shown in FIGS. 3a and 3b respectively together with the corresponding equivalent electrical circuits. Each elemental area of the capacitor includes a part of top plate 2 and of ground plate 1. Where no sample is inserted, as shown in FIG. 3a, the equivalent circuit of the top plate element alone is a diode D1 in parallel with a capacitor C1. The effect of the air gap is to include a further capacitor C0 in series with the D1/C1 combination. When however a sample is inserted in the air gap then the effect of the sample is to include a capacitance Cs in parallel with a resistor Rs. For a uniform sample the values of Cs and Rs should be the same over all of the elemental areas of the capacitor. Therefore when the top plate of the capacitor is scanned the reverse bias across all the elemental photodiodes will be of equal value. However if there is any non-uniformity in the sample the values of Cs and/or Rs will be different at different elemental areas which will result in different values of reverse bias across the elemental photodiodes at those positions. This difference will cause changes in the capacitor current flow as the beam scans the array.

While the top plate 2 of the capacitor has been shown as a continuous layer it will be appreciated that instead it can be made up of an array of individual photodiodes.

FIG. 4 shows equipment that is required for scanning the capacitor and displaying the information that is obtained. In FIG. 4 like parts have like reference numerals to FIG. 1. In FIG. 4 a flying spot scanner 11 produces a light beam 12 which is scanned in raster fashion across the top surface of plate 2 of the capacitor under the control of a scanning and blanking generator 13. A brightness modulation signal is applied to scanner 11 to modulate the brightness of beam 12. A suitable modulation frequency is 50 kHz. To detect changes in the capacitor current flow, plates 1 and 2 of the capacitor are connected to a 50 kHz filter and amplifier circuit 14 which passes the envelope of the 50 kHz component of the signal that is obtained when the light beam scans plate 2. The instantaneous value of the envelope will thus be a measure of the value of the reverse RF voltage bias at the point on top plate 2 scanned by light beam 12. The output from amplifier circuit 14 is fed to a display monitor 15. Display monitor 15 provides a full frame brightness modulated display which is a qualitative indication of the nature of the sample 4 inserted in the capacitor. Alternatively, to give a quantitative display of the nature of sample 14 a single line scan amplitude presentation of the signal can be provided to enable a precise measurement to be made.

I claim:

1. An apparatus for inspecting flat electrically insulating and/or conductive components comprising:
   a capacitor having a first plate in the form of a photodiode array;
   a second plate;
   means for applying a radio frequency signal between said first and second plates;
   means for scanning the exterior surface of the photodiode array with an optical beam; and
   means for detecting changes in the capacitor current flow as the beam scans the array; wherein the component for inspection becomes part of said capacitor so that capacitor current flow becomes effected thereby.

2. The apparatus as claimed in claim 1 in which means are provided for enabling insulating or semiconductor material for inspection to be inserted between the first plate and said second plate to act as at least part of the dielectric of said capacitor.

3. The apparatus as claimed in claim 1 in which said second plate comprises a component being tested.

4. The apparatus as claimed in claim 1 in which said first plate comprises a semitransparent conducting film deposited on a high purity silicon substrate to form a light sensitive Schottky barrier or heterojunction between the film and the substrate.

5. The apparatus as claimed in claim 1 in which means are provided for modulating the brightness of the scanning optical beam for producing corresponding modulation of the capacitor current.

6. The apparatus as claimed in claim 5 in which said detecting means includes a circuit for detecting the modulated capacitor current at the frequency of the brightness modulation signal.

7. The apparatus as claimed in claim 6 in which display means are provided for displaying the detected capacitor current signal in synchronism with the scanning of the optical beam.

8. A method of inspecting electrically insulating and/or conductive components, comprising the steps of:
   including a component to be tested as part of a capacitor, one plate of which comprises a photodiode array;
   applying a radio frequency signal across the capacitor so that current flow therein is at least in part determined by the component being tested;
   scanning the surface of the photodiode array with an optical beam; and
   detecting any changes in the resulting current flow as the beam scans the array.

9. The method as claimed in claim 8, wherein the including step comprises including the component to be tested as at least part of the dielectric of the capacitor.

10. The method as claimed in claim 8, wherein the including step comprises including the component to be tested as a plate of the capacitor.

11. The method as claimed in claim 8 further including the step of modulating the brightness of the scanning optical beam for producing corresponding modulation of the capacitor current.

* * * * *